(12) United States Patent
Dietz et al.

(10) Patent No.: US 7,189,619 B2
(45) Date of Patent: Mar. 13, 2007

(54) PROCESS FOR MANUFACTURING VERTICALLY INSULATED STRUCTURAL COMPONENTS ON SOI MATERIAL OF VARIOUS THICKNESS

(75) Inventors: Franz Dietz, Untereisesheim (DE); Volker Dudek, Brackenheim (DE); Michael Graf, Leutenbach (DE)

(73) Assignee: Atmel Germany GmbH, Heilbronn (DE)

( * ) Notice: Subject to any disclaimer, the term of this patent is extended or adjusted under 35 U.S.C. 154(b) by 93 days.

(21) Appl. No.: 11/045,382

(22) Filed: Jan. 31, 2005

(65) Prior Publication Data

US 2005/0167779 A1 Aug. 4, 2005

(30) Foreign Application Priority Data

Feb. 2, 2004 (DE) .................... 10 2004 005 951

(51) Int. Cl.
*H01L 21/336* (2006.01)
*H01L 21/8242* (2006.01)
*H01L 21/76* (2006.01)

(52) U.S. Cl. .................... 438/268; 438/430; 438/248; 257/E21.73; 257/E21.258

(58) Field of Classification Search ................ 438/268, 438/430, 248, 221, 208, 404, 405; 257/E21.564, 257/E21.703, E21.09, E21.258, E21.285, 257/E21.545
See application file for complete search history.

(56) References Cited

U.S. PATENT DOCUMENTS 5,457,338 A 10/1995 Borel

| | | | | |
|---|---|---|---|---|
| 6,015,727 A | * | 1/2000 | Wanlass | 438/218 |
| 6,100,151 A | * | 8/2000 | Park | 438/318 |
| 6,204,098 B1 | | 3/2001 | Anceau | |
| 6,335,235 B1 | * | 1/2002 | Bhakta et al. | 438/221 |
| 6,656,764 B1 | * | 12/2003 | Wang et al. | 438/104 |
| 6,664,146 B1 | | 12/2003 | Yu | |
| 7,001,804 B2 | * | 2/2006 | Dietz et al. | 438/164 |
| 2003/0027400 A1 | * | 2/2003 | Kim | 438/400 |
| 2003/0104681 A1 | | 6/2003 | Davari et al. | |
| 2005/0139890 A1 | * | 6/2005 | Koh | 257/301 |
| 2005/0167706 A1 | * | 8/2005 | Dudek | 257/288 |
| 2005/0167779 A1 | * | 8/2005 | Dietz et al. | 257/510 |
| 2005/0170571 A1 | * | 8/2005 | Dietz et al. | 438/164 |
| 2006/0063320 A1 | * | 3/2006 | Orlowski et al. | 438/199 |
| 2006/0148178 A1 | * | 7/2006 | Bonart et al. | 438/270 |

FOREIGN PATENT DOCUMENTS

| DE | 197 32 237 A1 | 7/1998 |
|---|---|---|
| EP | 1 049 156 A1 | 11/2000 |
| EP | 1 246 248 A2 | 10/2002 |

* cited by examiner

*Primary Examiner*—Walter Lindsay, Jr.
(74) *Attorney, Agent, or Firm*—McGrath, Geissler, Olds & Richardson, PLLC

(57) ABSTRACT

Vertically insulated active semiconductor regions having different thicknesses in an SOI wafer, which has an insulating layer, is produced. On the wafer, first active semiconductor regions having a first thickness are arranged in a layer of active semiconductor material. The second active semiconductor regions having a relatively smaller thickness are produced by epitaxial growth proceeding from at least one seed opening in a trench structure. The second semiconductor regions are substantially completely dielectrically insulated, laterally and vertically, from the first semiconductor regions by oxide layers. The width of the seed opening can be defined by lithography.

9 Claims, 3 Drawing Sheets

PROCESS FOR MANUFACTURING VERTICALLY INSULATED STRUCTURAL COMPONENTS ON SOI MATERIAL OF VARIOUS THICKNESS

This nonprovisional application claims priority under 35 U.S.C. § 119(a) on German Patent Application No. DE 102004 005 951 filed in Germany on Feb. 2, 2004, which is herein incorporated by reference.

BACKGROUND OF THE INVENTION

1. Field of the Invention

The present invention relates to a process for producing vertically insulated semiconductor areas having different thicknesses in an SOI (silicon-on-insulator) wafer, which has an insulating layer on which first active semiconductor areas with a first thickness are arranged in a layer of active semiconductor material.

2. Description of the Background Art

A process is known from U.S. Pat. No. 6,204,098, in which dielectrically insulated islands are produced on an SOI substrate. The insulated islands are filled by epitaxial growth. The active silicon layer of the SOI wafer serves as the seed. Only insulated islands of the same height can be produced by this means. An active layer within the islands has an initial, relatively large thickness. According to FIG. 6 of this publication, complementary MOS transistors are produced in the islands and vertical DMOS transistor cells outside the islands. The vertical DMOS transistor cells are flatter than the dielectrically isolated tubs. The vertical DMOS transistor cells are not dielectrically isolated from the substrate.

A structure is known from EP 1 049 156 A1 in which a trench structure (trench) is surrounded by oxide. The trench is filled by an ELO process (ELO=epitaxial lateral overgrowth) with use of a seed, which was produced in the bottom of the trench by opening the oxide layer. The seed opening is then closed by a trench. This is a costly and space-consuming structure.

BCDMOS technology (BCDMOS=bipolar-CMOS-DMOS) is generally understood to be integrated circuits and their manufacturing processes, in which high-voltage DMOS features are combined with low-voltage CMOS and bipolar properties on a chip. A voltage of five volts is a typical example of low voltage, whereas high voltage in this context is understood to be values of up to more than a hundred volts. DMOS transistors are used as high-voltage components, whereby the high voltage can be applied between the drain region and the source region of the transistor. For future concepts, it is absolutely necessary within the scope of BCDMOS technology to take into account the special requirements of both the CMOS area (low leakage current) and the DMOS area (high power, high dielectric strength, high heat dissipation). To avoid power losses in the CMOS portion (leakage current), to prevent parasitic capacitances, and thereby to improve among others the behavior of the transistors, layer thicknesses within the range of about 200 nm are necessary with silicon as the semiconductor material. This is contradicted, however, by the requirement of Smart Power components (on a DMOS basis) with a high voltage resistance and good heat dissipation. Both requirements lead to layer thicknesses that are clearly greater than the thickness of a micrometer.

In contrast to the bipolar technology, in MOS technologies there is a systematic approach to structure miniaturization by scaling of the length scale for component dimensions. Important electrical properties of MOS transistors do not depend on individual lengths, but rather on the ratios of transistor width and channel length. Based on this dependence, in principle all lengths and widths within a circuit can be reduced by a mutual scaling factor k, without a change in electrical properties.

The scale miniaturization of components in BCDMOS circuits with vertical SOI insulation, however, is limited by the aforementioned contradictory requirements. To minimize leakage currents at high temperatures, the active silicon thickness in the CMOS portion should be very thin, so that source and drain lie upon the buried oxide. In the DMOS drift region, the active silicon layer in contrast should be thicker to increase the dielectric strength.

SUMMARY OF THE INVENTION

It is therefore an object of the present invention to provide a method for producing semiconductor layers having a different thickness in an SOI wafer, whereby the semiconductor layers having a different thickness are insulated in the vertical direction from the underlying layers and in the lateral direction dielectrically from each other.

This object is achieved by a process of the aforementioned type in that second active semiconductor areas are produced with a relatively smaller thickness by, for example, the following steps:

Partial or total covering of the SOI wafer with a protective layer, in the covered areas production of a trench structure, which cuts through the protective layer and which extends deep into the layer of the active semiconductor material;

Covering of the trench structure with an oxide layer;

Defining of a subregion of the trench structure by a lithography masking step,

Creation of a seed opening within the trench structure by etching away of the oxide layer within the defined subregion;

Filling of the trench structure by selective epitaxial growth, proceeding from the seed opening, of semiconductor material for the second active semiconductor areas;

Planarization of the resulting structure and reduction of its thickness until the second active semiconductor areas do not project over the walls of the trench structure;

Reopening of the seed openings by another lithography and masking etching step; and Sealing of the opened seed openings by an insulating intermediate layer, so that the second semiconductor areas are completely dielectrically insulated laterally and vertically from the first semiconductor areas.

A seed is understood to be a surface structure of a single crystal to which atoms attach during the ELO process and thereby assume the crystal orientation of the single crystal.

These features are totally attained by the object. The described process permits simultaneous integration of low-power CMOS and high-power DMOS ("ultra-smart power") on silicon layer thicknesses having different thicknesses. The use of an SOI wafer permits integration of DMOS components on a thick SOI substrate and CMOS components on a thin SOI substrate with a mutual SOI technology on a wafer with a maximum packing density. The silicon overgrowing within the scope of this process after the complete process has no connection to the substrate, so that complete decoupling of the thin active semiconductor layers from the substrate is achieved. Overall, a method is presented which reduces this growth of leakage currents, as is expected with a scale reduction of the structure width.

It is preferred that the trench structure is produced by STI etching.

Trenches are produced between the active areas covered with a nitride protective layer by means of the "shallow trench isolation" technology and filled with an insulating material such as silicon dioxide or polysilicon. High packing densities can be achieved with the STI technology.

It is also preferred that the step of covering the SOI wafer with a protective layer comprises the following steps: covering of the SOI wafer with a first partial oxide layer; covering of the first partial oxide layer with a nitride layer; and covering of the nitride layer with a second partial oxide layer.

A so-called ONO (oxide-nitride-oxide) layer results due to this layer sequence. The ONO layer is used for the production of the trench structure as a hard mask. In comparison with a resist mask, the use of this type of hard mask improves the accuracy with which the angles and the form of the side walls of the trench structure are produced. Moreover, the nitride layer during later covering of the trench structure with an oxide layer prevents an undesirable oxidation of areas, lying outside the trench structure, of the surface of the active semiconductor material layer.

It is also preferred that the coating of the nitride layer with the second oxide layer occurs by the deposition of a TEOS oxide.

TEOS is the abbreviation for tetraethylorthosilicate. Silicone dioxide is formed from this compound at moderate temperatures (up to about 700° C.) by decomposition. During this process, which is also called TEOS pyrolysis, high-value oxide films form, which are characterized, for example, by a high breakdown field strength and a conformable edge coating.

In another preferred embodiment of the invention, the thickness of the protective layer is reduced by a planar removal of material until the nitride layer is exposed.

The exposed nitride layer can be used as a polishing stop in a later chemical/mechanical polishing process and is thus used repeatedly to a certain extent.

It is therefore preferred that the step of planarization of the resulting structure is carried out such that the exposed nitride layer is achieved as a polishing stop. The removal of the surface layers is controlled with a high accuracy in this way.

In a further preferred embodiment of the invention, the step of the production of a seed opening within the trench structure occurs by etching away the oxide layer within the defined subregion by means of an anisotropic etching process.

An etching process is described as isotropic, when etching attack proceeds more rapidly within certain spatial directions than in other spatial directions. As a result of etching occurring more rapidly in a perpendicular direction, the oxide here remains preferably on the inner wall regions of the trench structure and thus forms a lateral insulation between the first semiconductor areas and the second semiconductor areas within the depth of the trench structure, whereas oxide in the bottom area is etched away preferentially.

It is also preferred that silicon is used as the semiconductor material.

It has been proven successful that all of the aforementioned embodiments are compatible with prior-art silicon technology and can fully develop its specific advantages.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
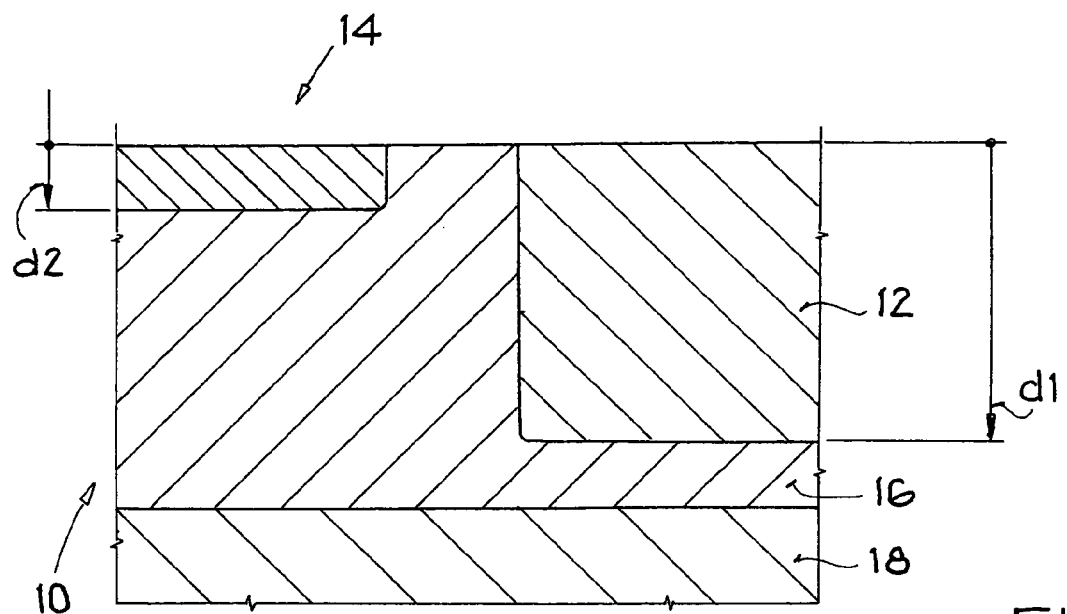
FIG. 1 is a cross section through an SOI wafer with areas differing in the thickness of the active semiconductor material.

FIG. 1 shows a detail of a cross-section of an SOI wafer 10, which has regions 12, 14 having an active semiconductor material, which differ in their thickness. The first region 12 has a relatively high thickness d1 and the second region 14 has a relatively low thickness d2. The regions 12, 14 are embedded in a dielectric layer 16, which extends to a handling layer 18. The second region 14 is suitable for realizing CMOS components because of its relatively low thickness. To avoid leakage currents and thereby power losses in the second region 14 and to prevent parasitic capacitances, the thickness d2 should comprise, for example, 200 nm. The first region 12 with its relatively large thickness d2 should be suitable for the realization of DMOS transistors having a high dielectric strength and good heat dissipation. The desired properties require a thickness d1 that should be greater than 1 µm. FIG. 1 illustrates thereby an SOI structure, in which the semiconductor regions 12, 14 with the different thicknesses d1, d2 are completely dielectrically insulated in the lateral and vertical direction.

Figure 2:
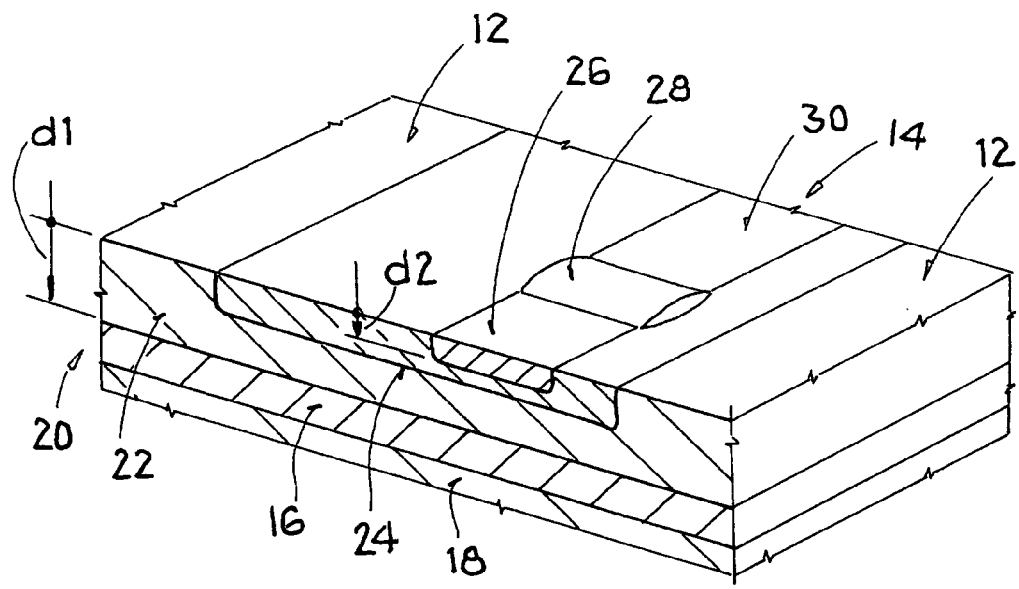
FIG. 2 is a detail of an SOI wafer having different thicknesses of active semiconductor areas and a CMOS transistor structure in the flatter SOI material as a typical product of the process of the invention according to a preferred embodiment.

A method for producing active semiconductor layers 12, 14, having different thicknesses d1, d2 in an SOI wafer, will be explained below with reference to FIGS. 1 to 8. For a better understanding of the manufacturing steps, FIG. 2 first shows a typical product of a method of the invention. Here, the number 20 refers to an SOI wafer, in which a layer of active semiconducter material 22 extends over an insulating layer 16. The insulating layer 16 in the embodiment according to FIG. 2 is an intermediate layer that is arranged on a carrier layer or handling layer 18. The active semiconductor material has regions 12, 14 having different thicknesses d1, d2. The second region 14 is laterally and vertically completely insulated from the first regions 12 by a dielectric separating structure 24. In the flat second region 14 having the thickness d2, typically field effect transistors are defined by subsequent doping steps and contacting. For illustration, a drain region 26, a gate region 28, and a source region 30 are shown in FIG. 2. In the first regions 12, whose layer thickness d1 in the present embodiment corresponds to the total thickness of the active semiconductor layer 22, DMOS transistors with the required properties can be produced by further doping steps and contacting steps.

Figure 3:
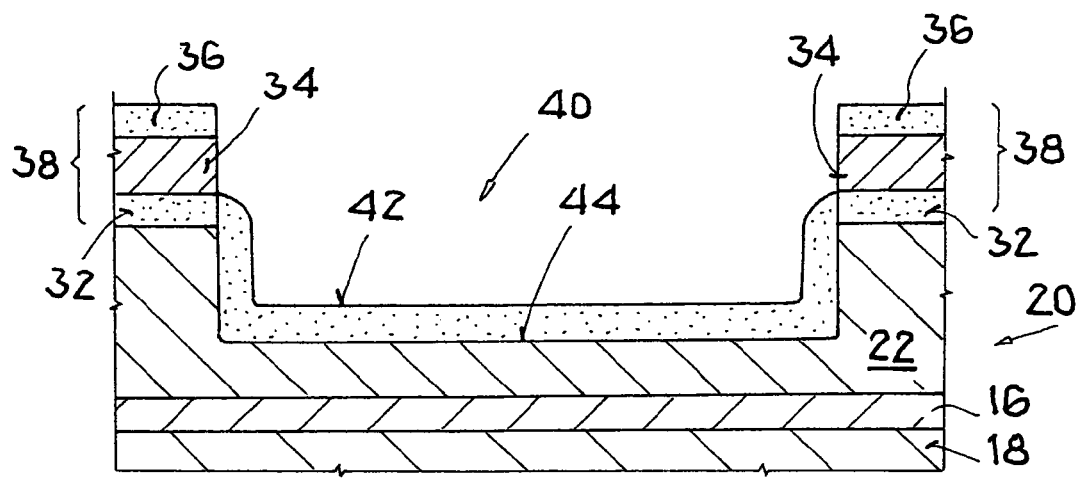
FIG. 3 illustrates an SOI wafer after a first process steps.

With reference to FIG. 3, several process steps for the production of the structure according to FIG. 2 will be explained. A planar SOI wafer is used as the starting product. The initially still planar SOI wafer is thermally oxidized, so that a first partial oxide layer 32, for example, having the thickness of 20 nm grows on its surface. Next, a nitride layer 34, for example, having a thickness of 100 nm is deposited on this first partial oxide layer 32 by, for example, a chemical vapor deposition (CVD) step. The nitride layer 34 is covered with a second partial oxide layer 36, which is preferably formed as a TEOS oxide and is 50 nm thick, for example. The layer sequence of a first partial oxide layer 32, nitride layer 34, and a second partial oxide layer 36 form a protective layer 38, also designated as an ONO multilayered dielectric, on the SOI wafer 20.

Next, a trench structure 40 is produced in the SOI wafer 20. This occurs preferably by a photolithography definition of the trench surface (masking step) on the protective layer 38 and a subsequent etching procedure; which comprises, for example, a reactive ionic etching. In so doing, ions from a plasma are accelerated by an electric field. When the ions impact the defined trench surface, surface atoms are released from the lattice of the active semiconductor layer 22, whereby chemical processes can be superimposed on this physical sputter effect. By continuous impacting of ions from the plasma on the defined trench surface, the trench structure 40 forms successively, which, for example, extends 300 nm deep into the active semiconductor layer 22. It is understood that the etching step can comprise several individual etching steps, whereby each individual step is selected preferably with consideration of the layer to be etched (oxide and/or nitride, active semiconductor material).

After the etching process is completed, a so-called liner oxidation occurs. This is understood to be the application of a relatively thin oxide layer 42 of, for example, a thickness of 100 nm onto the bottom and side surfaces 44 of the trench structure 40. The oxide layer 42 will later form a bottom layer of the dielectric separation structure 24 from FIG. 2. It forms a vertical insulation, which prevents or at least reduces the substrate couplings and thereby influences on CMOS structures, which are later formed above the separation structure 24 from FIG. 2.

Figure 4:
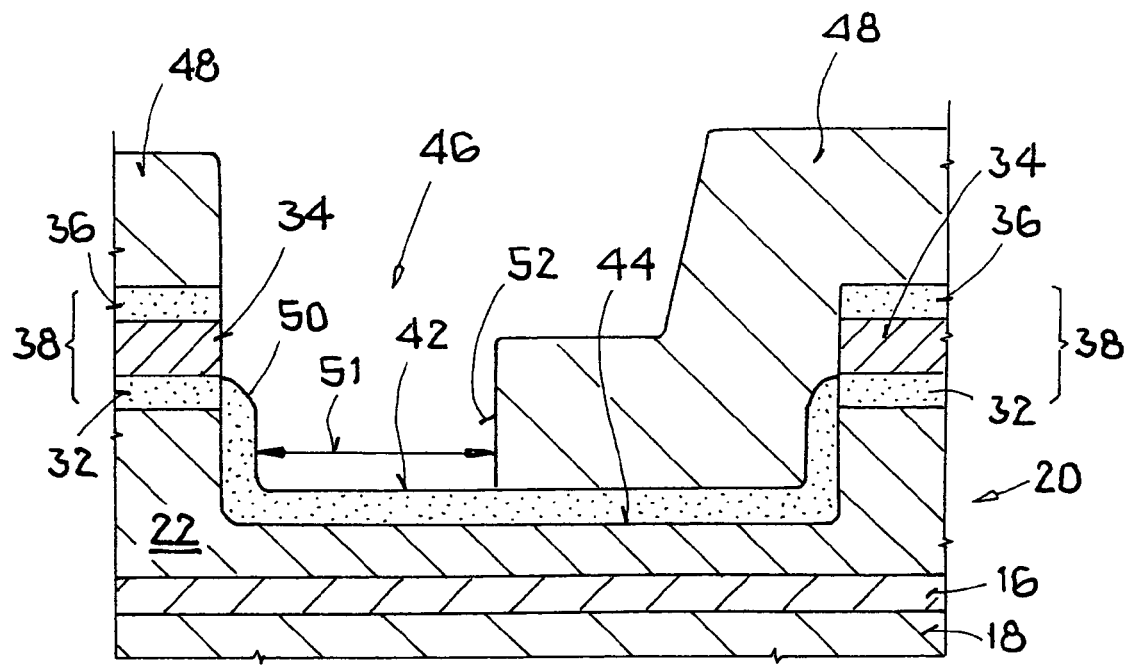
FIG. 4 illustrates the SOI wafer of FIG. 3 after a lithography and mask step.

A lithography and masking step follow to define a subregion 46 of the trench structure 40, in which a seed opening is to be produced later. FIG. 4 shows the detail from FIG. 3 with a lithographically produced mask 48. After the application of the mask 48, the portion 46, not covered by the mask 48, of the oxide layer 42, which covers the bottom of the trench structure 40, is removed by an anisotropic etching process. In so doing, the etching proceeds preferably in the direction of the bottom of the trench structure 40. Because of the anisotropy, a wall region 50 of the oxide layer 42 remains standing. The distance 51 between the wall region 50 and an opposite side 52 of the mask 48 defines the width of the seed opening for a later selective epitaxy step. In this respect, the width of the seed opening is defined lithographically.

Figure 5:
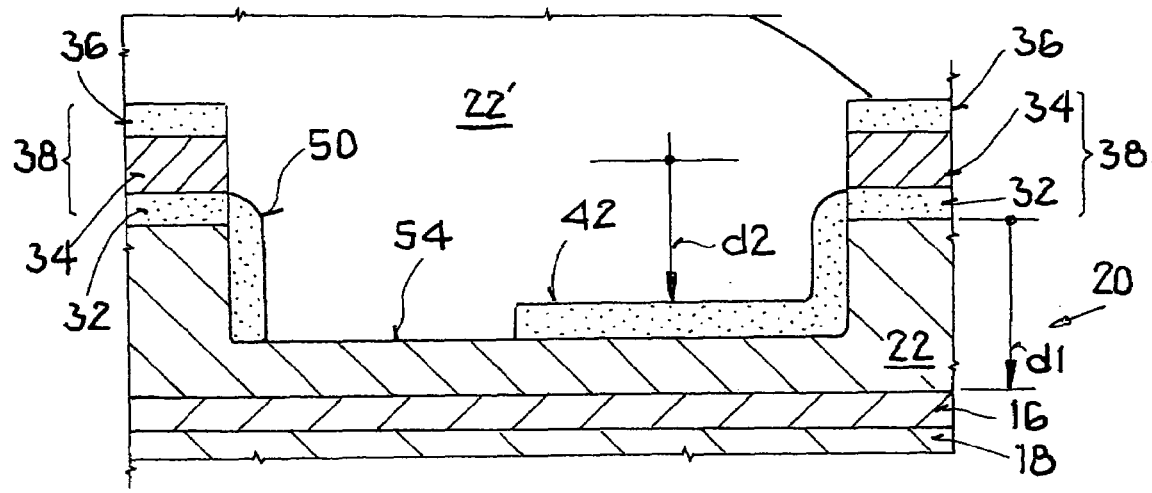
FIG. 5 illustrates the SOI wafer of FIG. 4 after an exposure of a seed opening and an epitaxy step.

FIG. 5 shows the detail from FIG. 4 after the exposure of a seed opening 54 by etching away of the oxide layer 42 within the defined subregion 46 and an epitaxy step. By means of the epitaxy step, the trench structure 40 is filled by the selective epitaxial growth, proceeding from the seed opening 54, of the active semiconductor material 22'. As a result, active semiconductor material 22' is produced for the second region 14 from FIG. 2. It is already evident from FIG. 5 that regions, having the different thicknesses d1, d2, of semiconductor material 22, 22' can be produced in the wafer 20 by the sequence described above, which are insulated vertically from each other dielectrically by the remainder of the oxide layer 42. In so doing, the thickness d2 can be achieved by removal of material.

Figure 6:
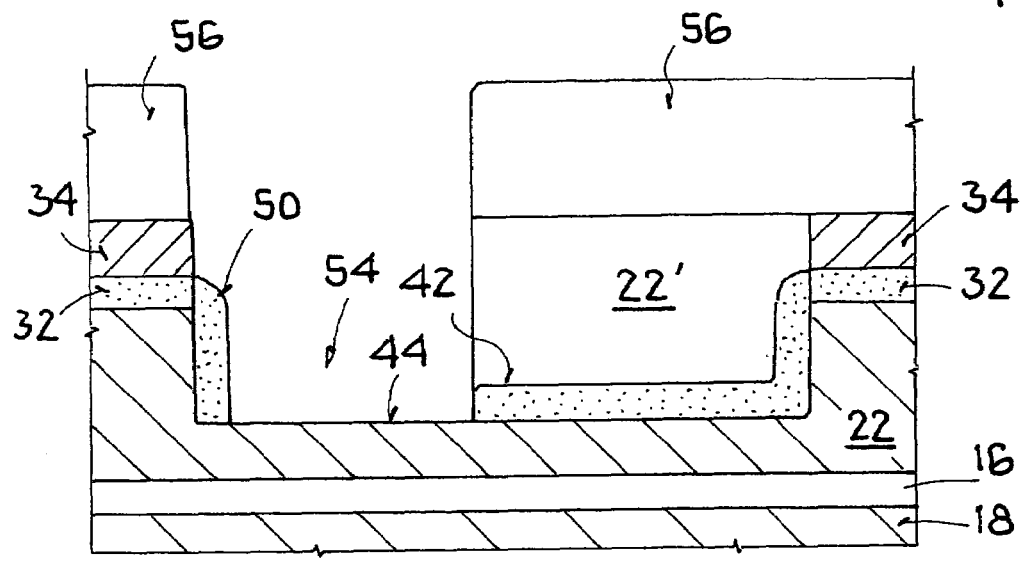
FIG. 6 illustrates the SOI wafer of FIG. 5 after further lithography, masking, and etching steps.

The further explanation refers to FIG. 6. The epitaxy step is followed by a planarization of the SOI wafer 20 by a chemical/mechanical polishing step. Preferably the step of planarization of the resulting structure is carried out so that the nitride layer 34 is reached as the polishing stop. The thickness of the protective layer 38 is therefore reduced by removal of material to the extent that the nitride layer 34 is exposed. Material for the later second semiconductor region 14 after the planarization does not project beyond the walls of the trench structure 40. Further lithography steps produce another mask 56, which is opened above the active semiconductor material 22' above the seed opening 54. In another etching step, the epitaxially grown semiconductor material is removed above the earlier seed opening 54, so that the earlier seed opening 54 is again opened. FIG. 6 shows the SOI wafer 20 after this opening step.

After the seed opening 54 is opened again, the mask 56 is removed and another oxidation step is performed. The oxidation step closes, in particular, the seed opening 54.

Figure 7:
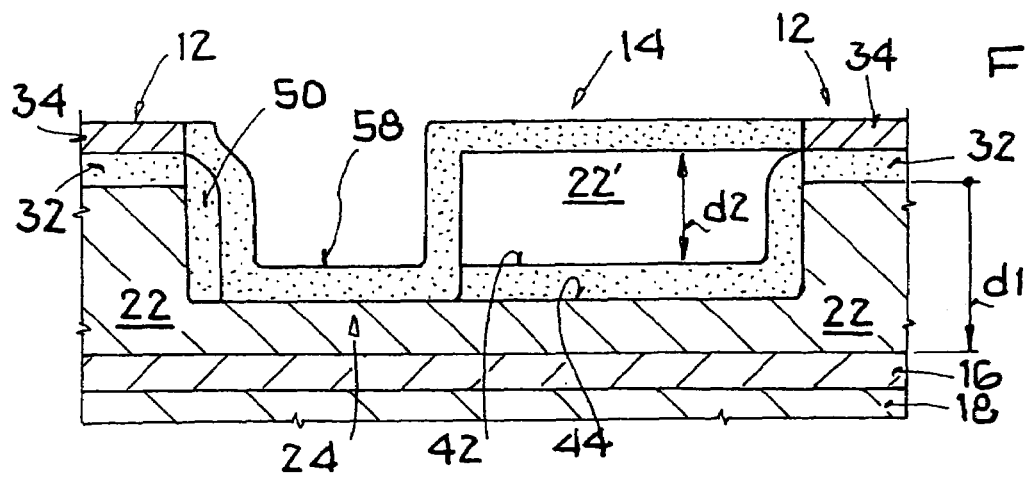
FIG. 7 illustrates the SOI wafer of FIG. 6 after closing of an earlier seed opening by an oxide.

FIG. 7 shows the detail from FIG. 6 after sealing of the previous seed opening by an oxide 58 as an insulating intermediate layer, so that the second semiconductor region 14 is insulated laterally and vertically completely dielectrically from the first semiconductor region 12. Oxide, which was deposited on surfaces outside the trench structure by the sealing of the seed opening, can be removed, for example, by another planarization step. The nitride layer 34 is also used preferably as a polishing stop in this type of additional planarization step.

The previously described sequence of steps produces a second semiconductor region 14 in the SOI wafer 20, which is insulated laterally and vertically completely dielectrically from the first semiconductor region 12. In so doing, the dielectric separation occurs by means of a separation structure 24, which includes the indicated oxides 50, 58 and the remainder of oxide layer 42.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing vertically insulated active semiconductor regions having different thicknesses in an SOI wafer, which includes an insulating layer, on which a first active semiconductor region having a first thickness in a layer of active semiconductor material is arranged, and a second active semiconductor region that has a smaller thickness than the first active semiconductor regions, the second active semiconductor region being formed by the following steps:

partially or completely covering the SOI wafer with a protective layer;

providing, in covered regions, a trench structure, which cuts through the protective layer and extends into a depth of the layer of the active semiconductor material;

covering the trench structure with an oxide layer;

defining a subregion of the trench structure by a lithography-masking step;

providing at least one seed opening within the trench structure by anisotropic etching of the oxide layer within the defined subregion;

filling the trench structure with selective epitaxial growth, proceeding from the seed opening of semiconductor material for the second active semiconductor areas;

planarizing the resulting structure and reducing a thickness thereof until the second active semiconductor regions do not project beyond the walls of the trench structure;

reopening the seed opening by a further lithography and masking etching step; and sealing the opened seed opening by an insulating intermediate layer, so that the second semiconductor regions are insulated laterally and vertically completely dielectrically from the first semiconductor regions.

2. The method according to claim 1, wherein the trench structure is produced by STI etching.

3. The method according to claim 1, wherein the step of coating of the SOI wafer with a protective layer comprises the following steps:

covering the SOI wafer with a first partial oxide layer;

covering the first partial oxide layer with a nitride layer; and covering the nitride layer with a second partial oxide layer.

4. The method according to claim 3, wherein the step of covering the nitride layer with the second partial oxide layer occurs by deposition of a TEOS oxide.

5. The method according to claim 1, wherein the thickness of the protective layer is reduced by planar removal of material until the nitride layer is exposed.

6. The method according to claim 1, wherein the step of planarization of the resulting structure is performed so that the nitride layer is reached as a polishing stop.

7. The method according to claim 1, wherein the step of the creation of a seed opening within the trench structure occurs by etching away of the oxide layer within the defined subregion by an anisotropic etching process.

8. The method according to claim 1, wherein the semiconductor material is silicon.

9. A method of forming a first region and a second region that are laterally and vertically insulated from one another by a dielectric separating structure in a semiconductor wafer, the method comprising the steps of:

providing an insulating layer on an upper surface of a carrier layer;

providing a third layer, which is made of an active semiconductor material, on an upper surface of the insulating layer;

covering the third layer with a protective layer;

forming a trench structure, in the second region, that extends through the protective layer and into the third layer;

applying a first oxide layer onto a lower surface and side walls of the trench structure;

forming a seed opening in a portion of the trench structure by etching;

providing an active semiconductor material within the trench structure;

etching the active semiconductor material within the trench structure in an area defined by the seed opening; and applying a second oxide at least within the trench structure.

* * * * *